United States Patent
Chan et al.

(10) Patent No.: US 8,857,486 B2
(45) Date of Patent: Oct. 14, 2014

(54) FLIP ARM MODULE FOR A BONDING APPARATUS INCORPORATING CHANGEABLE COLLET TOOLS

(75) Inventors: Chi Fung Chan, Hong Kong (CN); Kin Yik Hung, Hong Kong (CN)

(73) Assignee: ASM Technology Singapore Pte. Ltd., Singapore (SG)

( * ) Notice: Subject to any disclaimer, the term of this patent is extended or adjusted under 35 U.S.C. 154(b) by 370 days.

(21) Appl. No.: 13/100,713

(22) Filed: May 4, 2011

(65) Prior Publication Data

US 2012/0279660 A1 Nov. 8, 2012

(51) Int. Cl.
*B32B 37/00* (2006.01)
*H01L 21/67* (2006.01)

(52) U.S. Cl.
CPC ................................ *H01L 21/67144* (2013.01)
USPC .......................................... 156/378; 156/538

(58) Field of Classification Search
USPC .................. 156/538, 349, 350, 378, 539, 556
IPC .................................. B29C 65/00; B32B 37/00
See application file for complete search history.

(56) References Cited

U.S. PATENT DOCUMENTS

| | | | | |
|---|---|---|---|---|
| 4,784,421 A * | 11/1988 | Alvite' | ......................... | 294/86.4 |
| 5,351,872 A * | 10/1994 | Kobayashi | ..................... | 228/6.2 |
| 5,956,831 A * | 9/1999 | McCarthy et al. | ............. | 29/263 |
| 8,042,593 B2 * | 10/2011 | Yoon et al. | ..................... | 156/581 |
| 2001/0023222 A1* | 9/2001 | Germerodt et al. | ............. | 483/18 |
| 2002/0162217 A1* | 11/2002 | Hartmann et al. | ............. | 29/740 |
| 2003/0113192 A1* | 6/2003 | Ransom | ......................... | 414/281 |
| 2009/0176636 A1* | 7/2009 | Hayashi et al. | ................... | 483/1 |
| 2010/0093131 A1* | 4/2010 | Maeda | .......................... | 438/107 |
| 2011/0107573 A1* | 5/2011 | Fujioka et al. | ................ | 29/27 A |

* cited by examiner

*Primary Examiner* — James Sells
(74) *Attorney, Agent, or Firm* — Sughrue Mion, PLLC

(57) ABSTRACT

An electronic device bonding apparatus comprises a flip arm for picking up an electronic device, the flip arm being operative to invert an orientation of the electronic device. A collet tool which contacts the electronic device and secures it to the flip arm is detachably mountable onto the flip arm, and a bond arm may pick up the electronic device from the collet tool to bond the electronic device to a bonding surface. Additionally, a tool changer module is operative to detach the collet tool from the flip arm and to mount another collet tool onto the flip arm.

10 Claims, 3 Drawing Sheets

FLIP ARM MODULE FOR A BONDING APPARATUS INCORPORATING CHANGEABLE COLLET TOOLS

FIELD OF THE INVENTION

The invention relates to a bonding apparatus, and in particular, to a bonding apparatus including a flip arm for changing an orientation of an electronic device prior to bonding.

BACKGROUND AND PRIOR ART

A Multi-Flip-Chip package has one or more flipped semiconductor devices, such as integrated circuit chips and Micro Electro-Mechanical Systems ("MEMS"), that are attached on a substrate via a flip chip bonding process. In a flip chip bonding machine for performing the flip chip bonding process, singulated wafer dice or chips which have been cut and positioned on a wafer table are first picked up by a flip arm. The semiconductor devices are then transferred to a bond head using a "pick-and-flip" operation. After the bond head picks up the semiconductor device, the bond head then attaches the device with its front side containing electrical contacts facing down onto a substrate pad which has been aligned accordingly to receive it.

A flip arm module is used to perform the pick-and-flip operation, and it comprises a picking collet and a flipping mechanism. As the multiple semiconductor devices may have different sizes, different collets will have to be used depending on the different sizes of the semiconductor devices. However, a flip chip bonding machine can conventionally only support one type of collet in the flip arm module. For Multi-Flip-Chip packages, a cascade line system or a dual head system comprising more than one bond head may be utilized to increase throughput. In a cascade line system, two or more individual flip chip bonders are linked through a substrate conveying device. The first flip clip bonder will bond one type of device onto the substrate and then pass the substrate to the second flip clip bonder by way of the substrate conveying device. The second flip chip bonder will be operative to bond another type of semiconductor device on the substrate, and so on if there are more than two flip chip bonders.

In the cascade line system, since two or more machines are connected together, a large footprint is required and malfunction of one machine will affect the overall system performance. Moreover, the two machines have separate optical alignment systems, meaning that different semiconductor devices will be bonded on the aligned pad with different optical alignment systems. This will lead to additional alignment errors and bonding errors due to the misalignment and variation between respective machines. As a result, the bonding accuracy when bonding different types of semiconductor devices will be affected.

In a dual head system, one machine comes with two separate flip arms. A different collet may be installed on each flip arm for handling different types of semiconductor devices in order to assemble Multi-Flip-Chip packages. Different semiconductor devices will be picked and flipped one at a time. Single or dual bond heads may then be used to attach the flipped devices onto the substrate.

However, the dual head system is limited to handling two different types of semiconductor devices only. Also, when one flip arm is operating, the other flip arm is idling since a shared wafer table system is typically used. This affects the utilization of the machine and hence the overall throughput of the machine.

SUMMARY OF THE INVENTION

It is thus an object of the invention to seek to provide a bonding apparatus which is capable of handling semiconductor devices of different sizes or types for bonding different semiconductor devices onto substrates.

Accordingly, the invention provides an electronic device bonding apparatus comprising: a flip arm for picking up an electronic device, the flip arm being operative to invert an orientation of the electronic device; a collet tool detachably mountable onto the flip arm, the collet tool being operative to contact the electronic device and secure it to the flip arm; a bond arm for picking up the electronic device from the collet tool and bonding the electronic device to a bonding surface; and a tool changer module operative to detach the collet tool from the flip arm and to mount another collet tool onto the flip arm.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of an apparatus in accordance with the invention will now be described with reference to the accompanying drawings, in which.

DETAILED DESCRIPTION OF THE PREFERRED EMBODIMENT OF THE INVENTION

Figure 1:
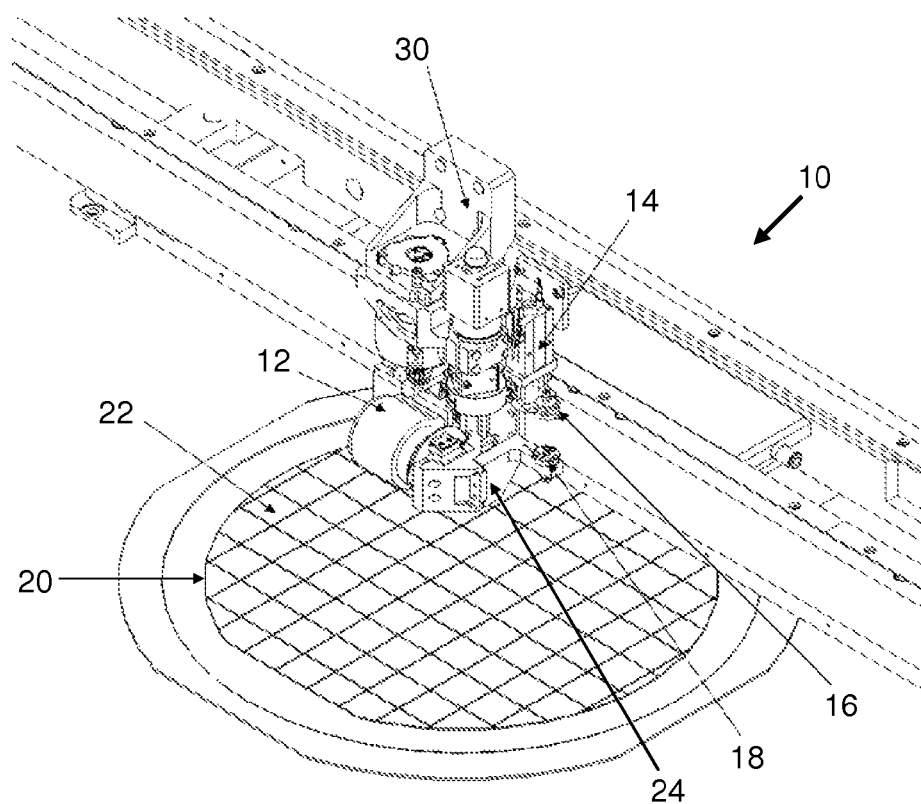
FIG. 1 is an isometric view of a bonding apparatus including a flip arm module according to the preferred embodiment of the invention.

FIG. 1 is an isometric view of an electronic device bonding apparatus 10 including a flip arm module 12 according to the preferred embodiment of the invention. The bonding apparatus 10 further comprises an external handler such as a tool changer module 14, which includes a collet gripper 16 at a bottom side of the tool changer module 14. The tool changer module 14 is installed on a positioning table, such as an X-Y table, and the collet gripper 16 has a controllable grip-and-release operation. The tool changer module 14 is movable between the flip arm module 12 and a supply of collet tools 26, and the collet gripper 16 is operative to grip onto and transfer the collet tools 26 either to the flip arm module 12 or away from the flip arm module 12.

The flip arm module 12 has a collet holder 18 at one end of its pivoted flip arm 24, and the collet holder 18 includes a holder catch. The holder catch of the collet holder 18 is configured such that it has mounting and self-alignment means to easily allow the collet tool 26 to be mounted onto the end of the pivoted flip arm 24 when the tool changer module 14 transfers a collet tool 26 to the collet holder 18, or for the tool changer module 14 to remove a collet tool 26 from the collet holder 18. The holder catch may comprise a magnetic device configured for mounting the collet tool 26 using a magnetic attraction force, a slot or some other positioning and mounting device.

A wafer 20 mounted on a wafer table is typically positioned below the flip arm module 12. The wafer 20 contains a plurality of electronic devices, such as semiconductor devices 22, which are to be bonded by the bonding apparatus 10. In the illustrated embodiment of the bonding apparatus 10, a bond arm 30 is located adjacent to the tool changer module 14 and is coupled to and movable together with the tool changer module 14. The bond arm 30 picks up a semiconductor device 22 from the collet tool 26 and bonds the semiconductor device 22 to a bonding surface.

Figure 2:
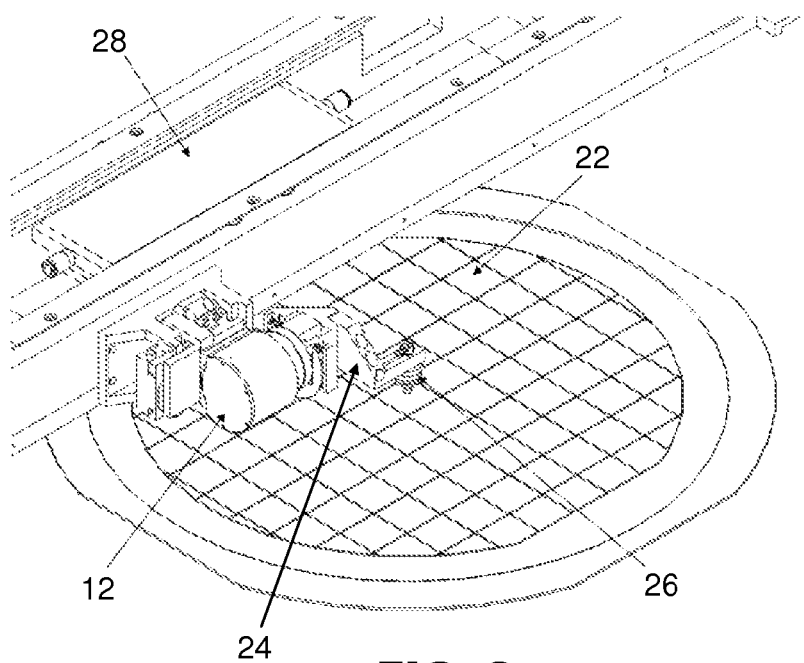
FIG. 2 is an isometric view of the flip arm module at a first position to pick up a semiconductor device comprised in a wafer.

FIG. 2 is an isometric view of the flip arm module 12 rotated to a first position to pick up a semiconductor device 22 comprised in the wafer 20. The collet tool 26 located on the collet holder 18 makes contact with a semiconductor device 22 at a pick-up position, and applies a vacuum suction force to hold onto the semiconductor device 22 and to secure it to the flip arm module 12. At this time, a back side of the semiconductor device 22 is facing downwards, such that its electrical contacts to be bonded to a substrate are facing upwards. At the same time, a substrate (not shown) is placed onto a substrate platform 28, where bonding of the semiconductor device 22 by the bond arm 30 is to be performed.

Figure 3:
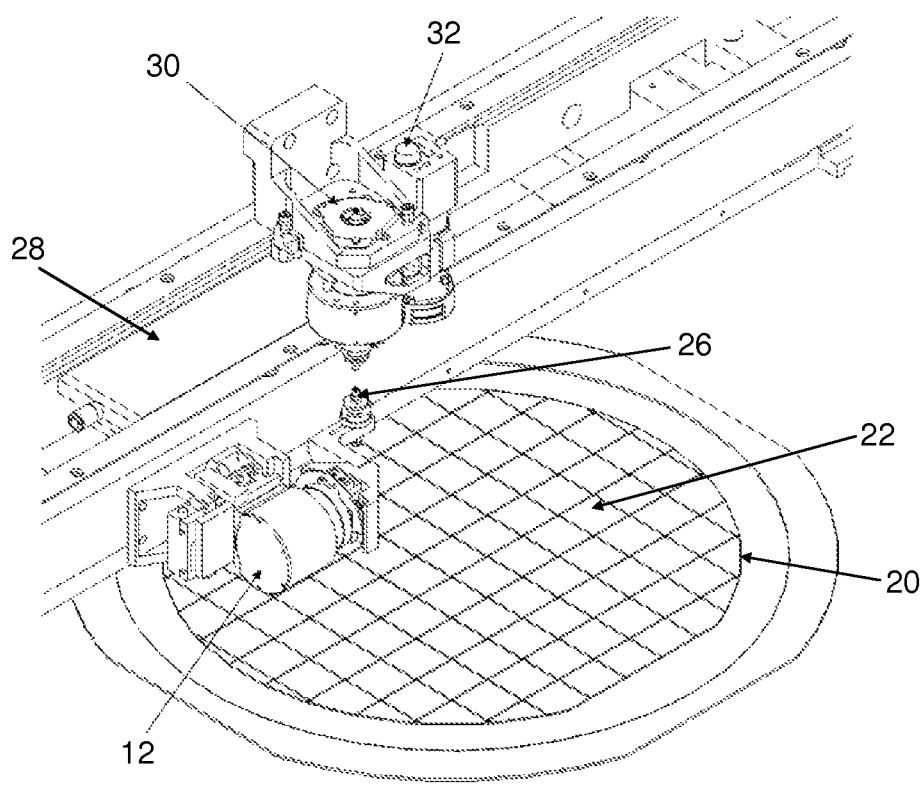
FIG. 3 is an isometric view of the flip arm module at a second position to transfer the semiconductor device to a bond arm to conduct bonding.

FIG. 3 is an isometric view of the flip arm module 12 rotated to a second position to transfer the semiconductor device 22 to a bond arm 30 for subsequent bonding of the semiconductor device 22. At this point, the orientation of the semiconductor device 22 has been inverted. A bond arm optical system 32 locates a position of the semiconductor device 22 and checks its alignment. In accordance with the alignment information, the bond arm 30 is positioned over the collet holder 18 holding the semiconductor device 22, which now has its back side facing upwards and its electrical contacts facing downwards. The bond arm 30 then applies vacuum suction pressure to hold onto the semiconductor device 22 whereas the vacuum suction pressure in the flip arm module 12 is switched off. The bond arm 30 will thereafter hold onto and move the semiconductor device 22 to a position over the substrate platform 28, and bond the semiconductor device 22 onto a substrate that is located on the substrate platform 28.

Figure 4:
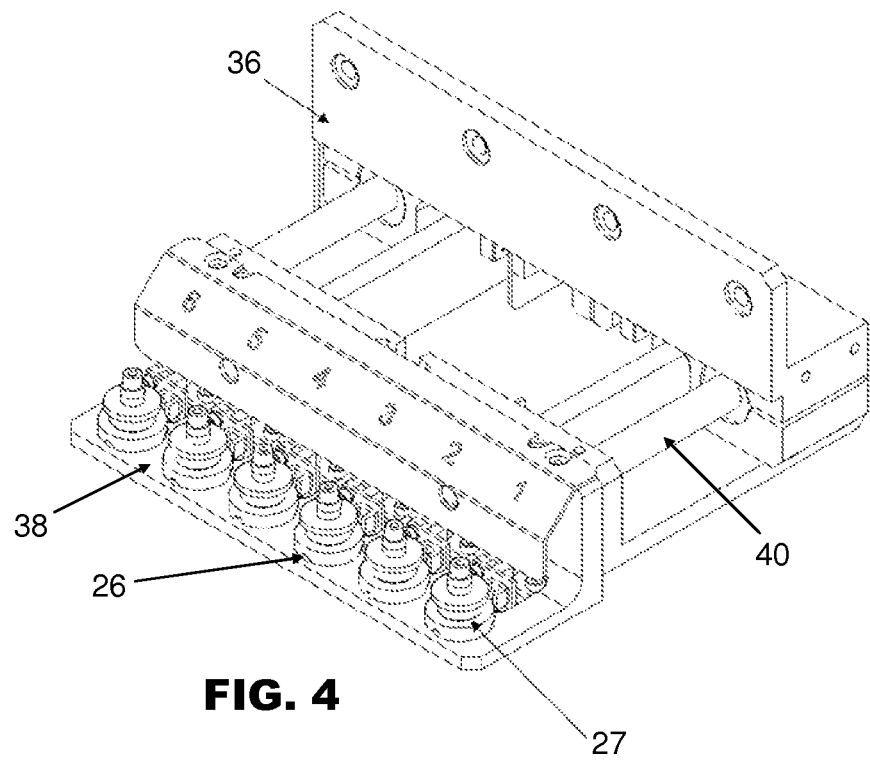
FIG. 4 is an isometric view of a tool rack that is configured to hold a plurality of collet tools for attachment onto the flip arm module.

FIG. 4 is an isometric view of a tool rack 36 that is configured to hold a plurality of collet tools 26 which may be picked up by the tool changer module 14 for attachment onto the flip arm module 12. Different collet tools 26 are positionable into different tool slots of the tool rack 36. The tool slots are preferably arranged in a row, each tool slot being configured to hold one collet tool 26. The tool slots may have individual sensors for detecting whether a collet tool 26 is present on each tool slot, and optionally, the type of collet tool 26 being held in the tool slot.

The collet tools 26 are lined up along a tool rack platform 38 so that the collet gripper 16 is able to grip onto a collet tool 26 of a correct configuration for bonding a corresponding semiconductor device 22. Each collet tool 26 further has a groove 27 for gripping by the collet gripper 16. Moreover, the tool rack 36 may comprise one or more extendable rods 40 mounted to the tool rack 36 which are drivable to extend the tool rack 36 in directions towards or away from the tool changer module 14 to facilitate pick-up of the collet tool 26 by the collet gripper 16, or to retract the tool rack 36 after a tool change operation.

Figure 5:
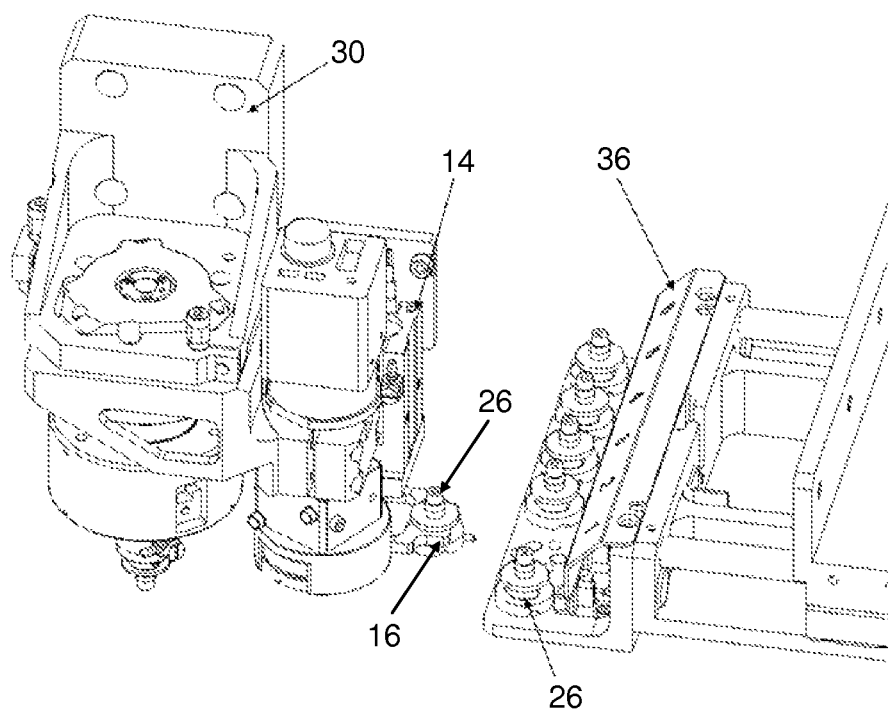
FIG. 5 is an isometric view of the tool changer module removing a collet tool from the tool rack for attaching the collet tool onto the flip arm module.

FIG. 5 is an isometric view of the tool changer module 14 removing a collet tool 26 from the tool rack 36 for attaching the collet tool 26 onto the flip arm module 12. The collet gripper 16 may comprise a pair of grippers which are positionable onto the grooves 27 of the collet tools 26 to grip the same. The tool changer module 14 moves the collet gripper 16 to a collet tool 26 of the desired configuration and positions the collet gripper 16 into the groove of the said collet tool 26. The collet gripper 16 may incorporate sensors for detecting its open and closed positions, as well as whether a collet tool 26 is being gripped. After the collet tool 26 is gripped, the tool changer module 14 removes the said collet tool 26 from the tool rack 36 and positions the collet tool 26 onto the collet holder 18 of the pivoted flip arm 24.

After completing the process of bonding one size of semiconductor devices 22, the tool changer module 14 may then remove the collet tool 26 from the collet holder 18 and replace it in a collet tool 26 change operation.

During the collet tool 26 change operation, the "pick-and-flip" operation of the pivoted flip arm 24 should be stopped. The pivoted flip arm 24 should be maintained in the second position for changing the collet tool 26. The tool changer module 14 will move to the above the collet holder 18 location, and the collet gripper 16 will grip the collet tool 26 attached to the collet holder 18 and detach it. Then, the tool changer module 14 will move to the tool rack 36 and release the collet tool 26 onto a corresponding tool slot of the tool rack platform 38. Another collet tool 26 is gripped by the collet gripper 16 from another tool slot. After moving the collet tool 26 to a location on top of the collet holder 18, the collet tool 26 will be released onto the collet holder 18 of the pivoted flip arm 24. The collet tool 26 will be aligned with and attached to the collet holder 18 using the holder catch. Once the new collet tool 26 is in place, the "pick-and-flip" operation of the flip arm module 12 can resume. In this way, another different type and/or size of semiconductor devices 22 may automatically be processed without human intervention.

It should be appreciated that bonding apparatus 10 according to the preferred embodiment of the invention integrates an automatic tool changer onto the flip arm module 12 of a flip chip bonding machine. Therefore, semiconductor packages requiring different sizes of semiconductor devices to be bonded, such as Multi-Flip-Chip packages, can be handled in single pass.

Another advantage of the bonding apparatus 10 is that, by using a single machine instead of multiple machines, the footprint of the apparatus can be minimized. It also avoids idling time that would have to be incurred if substrate transfer between different machines is necessary. Moreover, avoiding substrate transfer minimizes any thermal change effect on the package and the system and leads to better bonding consistency. By bonding different semiconductor devices in the same pass with the same alignment system, one can also achieve higher bonding accuracy between the semiconductor devices and the substrates.

The invention described herein is susceptible to variations, modifications and/or additions other than those specifically described and it is to be understood that the invention includes all such variations, modifications and/or additions which fall within the spirit and scope of the above description.

The invention claimed is:
1. A semiconductor device bonding apparatus comprising:
a flip arm for picking up a semiconductor device, the flip arm being operative to invert an orientation of the semiconductor device;

a collet tool detachably mountable onto the flip arm, the collet tool being operative to pick up the semiconductor device and secure the semiconductor device to the flip arm;

a bond arm for picking up the semiconductor device from the collet tool and bonding the semiconductor device to a bonding surface; and a tool changer module operative to detach the collet tool from the flip arm and to mount another collet tool onto the flip arm, wherein the bond arm is coupled to and movable together with the tool changer module.

2. An electronic device bonding apparatus comprising:

a flip arm for picking up an electronic device, the flip arm being operative to invert an orientation of the electronic device;

a collet tool detachably mountable onto the flip arm, the collet tool being operative to contact the electronic device and secure it to the flip arm;

a bond arm for picking up the electronic device from the collet tool and bonding the electronic device to a bonding surface; and a tool changer module operative to detach the collet tool from the flip arm and to mount another collet tool onto the flip arm, wherein the bond arm is coupled to and movable together with the tool changer module.

3. The electronic device bonding apparatus as claimed in claim 2, wherein the tool changer module further comprises a pair of grippers that are controllable to grip onto or release the collet tool.

4. The electronic device bonding apparatus as claimed in claim 3, wherein the collet tool comprises a groove onto which the pair of grippers are positionable in order to grip the collet tool.

5. The electronic device bonding apparatus as claimed in claim 2, further comprising a positioning table on which the tool changer module is installed for moving the tool changer module between the flip arm and a supply of collet tools.

6. The electronic device bonding apparatus as claimed in claim 2, further comprising a collet holder on the flip arm for mounting the collet tool, wherein the collet holder has a magnetic device configured for mounting the collet tool using a magnetic attraction force.

7. The electronic device bonding apparatus as claimed in claim 2, further comprising a tool rack configured to hold a plurality of collet tools which may be picked up by the tool changer module.

8. The electronic device bonding apparatus as claimed in claim 7, wherein the tool rack comprises a row of tool slots, each tool slot being configured to hold one collet tool.

9. The electronic device bonding apparatus as claimed in claim 8, further comprising a sensor located at each tool slot for detecting whether a collet tool is present on the tool slot.

10. The electronic device bonding apparatus as claimed in claim 7, further comprising an extendable rod coupled to the tool rack that is operative to drive the tool rack in directions towards or away from the tool changer module.

* * * * *